(12) United States Patent
Beyne

(10) Patent No.: US 9,960,080 B2
(45) Date of Patent: May 1, 2018

(54) METHOD FOR BONDING AND INTERCONNECTING INTEGRATED CIRCUIT DEVICES

(71) Applicant: IMEC vzw, Leuven (BE)

(72) Inventor: Eric Beyne, Leuven (BE)

(73) Assignee: IMEC vzw, Leuven (BE)

( * ) Notice: Subject to any disclaimer, the term of this patent is extended or adjusted under 35 U.S.C. 154(b) by 0 days. days.

(21) Appl. No.: 15/199,147

(22) Filed: Jun. 30, 2016

(65) Prior Publication Data

US 2017/0005000 A1    Jan. 5, 2017

(30) Foreign Application Priority Data

Jul. 1, 2015 (EP) .................... 15174765

(51) Int. Cl.
  *H01L 21/768* (2006.01)
  *H01L 21/311* (2006.01)
  *H01L 21/4763* (2006.01)
  *H01L 23/48* (2006.01)
  *H01L 25/00* (2006.01)
  *H01L 25/065* (2006.01)
  (Continued)

(52) U.S. Cl.
  CPC .... *H01L 21/76898* (2013.01); *H01L 21/0212* (2013.01); *H01L 21/02118* (2013.01); *H01L 21/31116* (2013.01); *H01L 21/31144* (2013.01); *H01L 21/7681* (2013.01); *H01L 21/76808* (2013.01); *H01L 21/76831* (2013.01); *H01L 21/76844* (2013.01); *H01L 23/481* (2013.01); *H01L 25/065* (2013.01); *H01L 25/0657* (2013.01); *H01L 25/50* (2013.01); *H01L 21/76805* (2013.01); *H01L 21/76877* (2013.01); *H01L 24/80* (2013.01); *H01L 2221/1036* (2013.01); *H01L 2224/80895* (2013.01); *H01L 2224/80896* (2013.01); *H01L 2224/9202* (2013.01); *H01L 2225/06544* (2013.01)

(58) Field of Classification Search
  CPC ............. H01L 21/76898; H01L 23/481; H01L 25/0657
  See application file for complete search history.

(56) References Cited

U.S. PATENT DOCUMENTS 7,485,968 B2    2/2009  Enquist et al.
9,041,206 B2    5/2015  Tsai et al.
(Continued)

*Primary Examiner* — Victor A Mandala
*Assistant Examiner* — Regan J Rundio
(74) *Attorney, Agent, or Firm* — Knobbe Martens Olson & Bear LLP

(57) ABSTRACT

A method for bonding and interconnecting two or more IC devices arranged on substrates such as silicon wafers is disclosed. In one aspect, the wafers are bonded by a direct bonding technique to form a wafer assembly, and the multiple IC devices are provided with metal contact structures. A TSV (Through Semiconductor Via) is produced through the bonded wafer assembly. The IC device or devices in the upper wafer or wafers have contact structures that serve as masks for the etching of the TSV opening. A conformal isolation liner is deposited in the TSV opening, and subsequently removed from the bottom and any horizontal areas in the TSV opening, while maintaining the liner on the sidewalls, followed by deposition of a TSV plug in the TSV opening. The removal of the liner is done without applying a lithography step.

18 Claims, 13 Drawing Sheets

(51) Int. Cl.
*H01L 21/02* (2006.01)
*H01L 23/00* (2006.01)

(56) References Cited

U.S. PATENT DOCUMENTS

| | | | |
|---|---|---|---|
| 2002/0177303 A1* | 11/2002 | Jiang | H01L 21/76844 438/653 |
| 2007/0037379 A1* | 2/2007 | Enquist | H01L 21/76898 438/618 |
| 2012/0313227 A1* | 12/2012 | Or-Bach | H01L 23/552 257/659 |
| 2014/0110374 A1* | 4/2014 | Brencher | H01L 21/31116 216/67 |
| 2014/0264947 A1* | 9/2014 | Lin | H01L 21/768 257/777 |
| 2015/0179612 A1 | 6/2015 | Tsai et al. | |
| 2015/0235949 A1 | 8/2015 | Yu et al. | |
| 2015/0348917 A1* | 12/2015 | Tsai | H01L 21/76898 257/774 |

\* cited by examiner

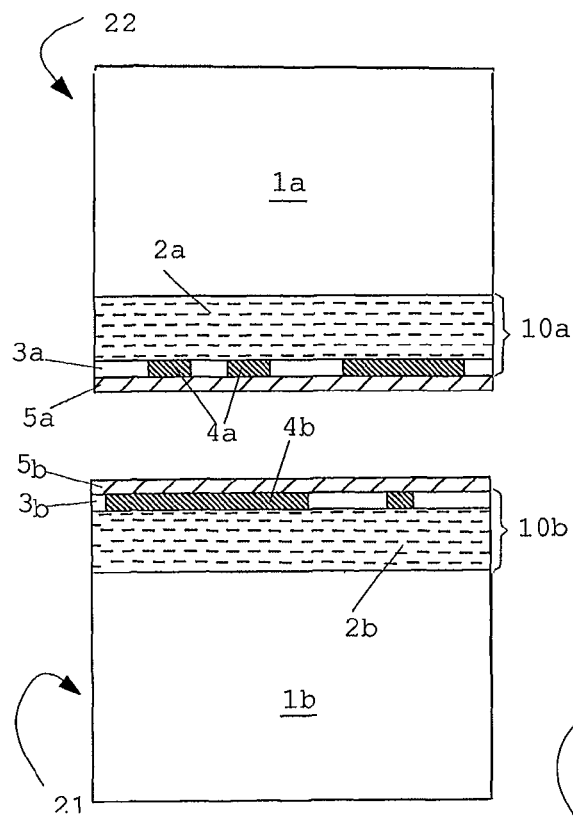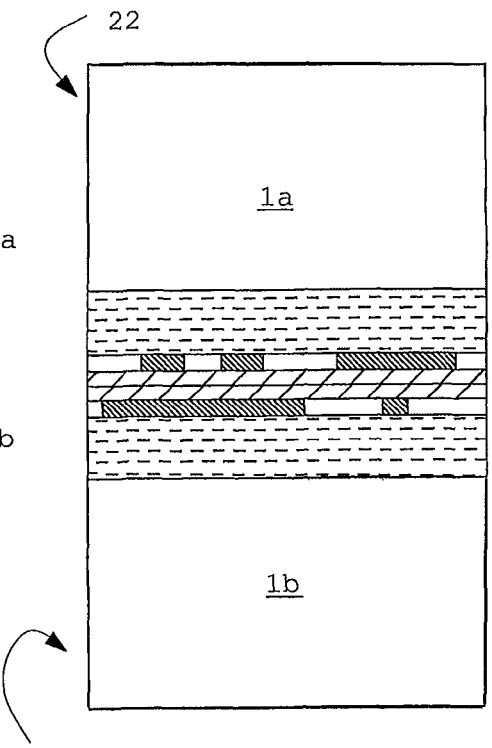
FIG. 1A  FIG. 1B
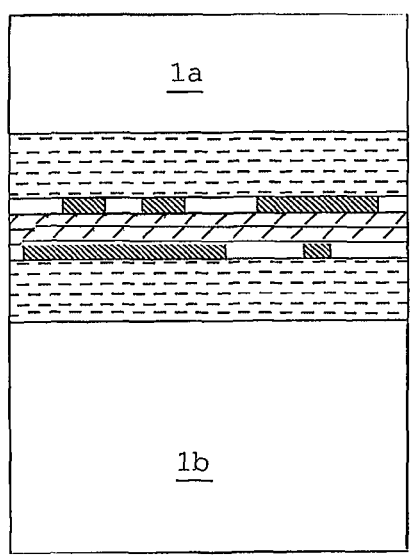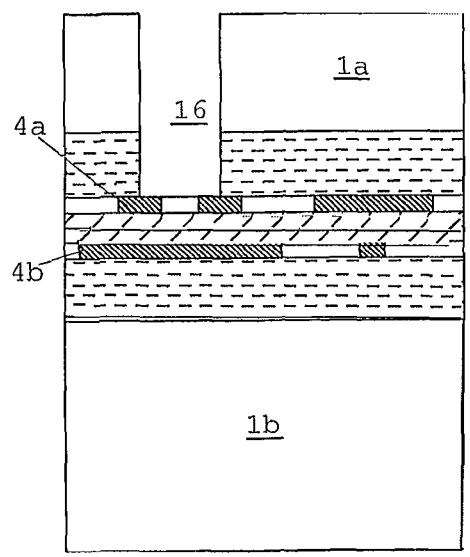
FIG. 1C  FIG. 1D

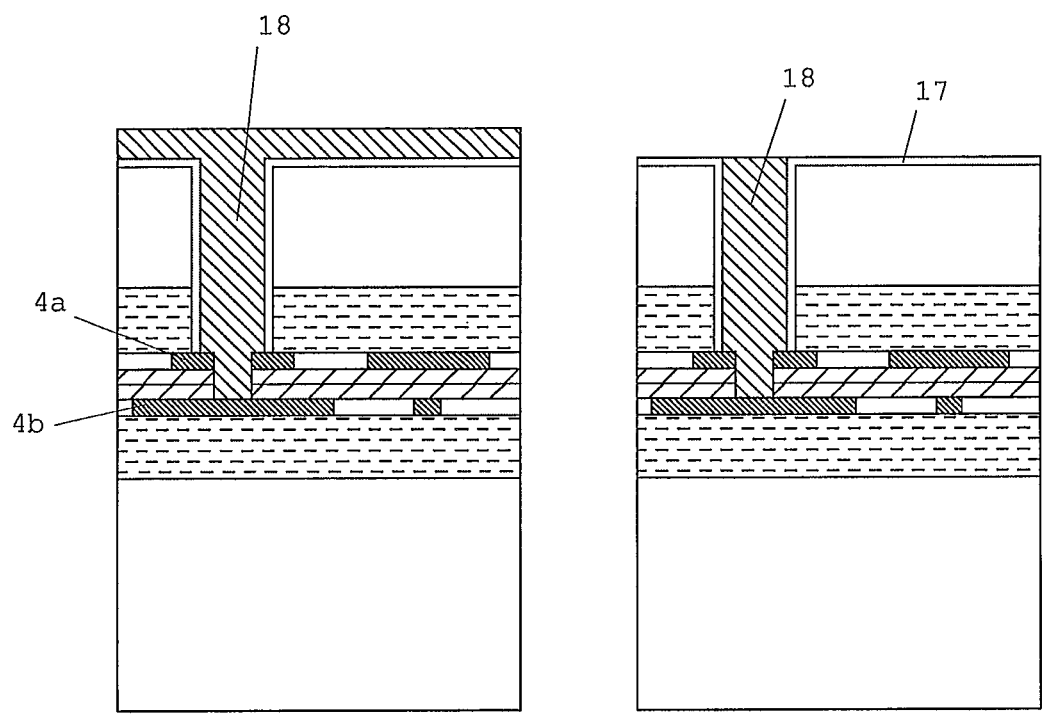

METHOD FOR BONDING AND INTERCONNECTING INTEGRATED CIRCUIT DEVICES

CROSS-REFERENCE TO RELATED APPLICATIONS

This application claims foreign priority to European Patent Application No. 15174765.6, filed Jul. 1, 2015, the contents of which are incorporated by reference herein in its entirety.

BACKGROUND

Technological Field

The present disclosure is related to semiconductor processing, in particular to the production of Through Semiconductor Vias for interconnecting stacked IC devices.

Description of the Related Technology 3D-integration of integrated circuit devices, hereafter also referred to as chips or semiconductor chips, produced on semiconductor wafers, has known many developments in recent years. The direct oxide-to-oxide bonding technique is one of the improvements which allows a very effective wafer bonding. It does however not result in electrical connections between both wafers or provide for external connections to both wafers. To make such connections, it is known in the present state of the art to produce at least two via-contacts (Through Si vias, TSVs or more generally referred to as Through Semiconductor Vias) from the backside of the stack, reaching contacts on the two wafers respectively. Connections are then realized by an additional interconnect, applied after bonding and TSV formation. Disadvantageously, such an additional interconnect increases the capacitance, resistance and inductance of the interconnect structure. Also, because of the tolerance of the wafer-to-wafer bonding technique, the landing pad on the bottom wafer has to be larger than the diameter of the minimum via size by at least two times the overlay tolerance of the wafer-to-wafer bonding plus two times the overlay accuracy of the backside lithography versus the stacked wafer pair fiducials. This results in relatively large via capture pads and limits achievable interconnect pitch.

U.S. Publication No. 20140264862 proposes the fabrication of a single TSV plug for contacting two stacked wafers. This is done by bonding two wafers, each comprising a substrate and an IMD (intermetal dielectric) portion comprising metal structures (bond pads, circuitry etc.), so that one intermetal dielectric is bonded to the other, thinning the top wafer, producing a first opening through the top wafer, producing a second opening through the IMD of the top wafer and partially through the 1 MB of the bottom wafer, while using metal structures in the top wafer as a hardmask, so that the single plug forms a connection between the circuitry of the top wafer's 1 MB and the bottom wafer's IMD. This production of two openings requires two lithography steps, which in turn requires large dimensions of the TSV diameter and of the metal contact structures in order to take into account the overlay accuracy of the two lithography steps.

SUMMARY OF CERTAIN INVENTIVE ASPECTS

The present disclosure is related to a method as described in the appended claims. The present disclosure is related to a method for bonding and interconnecting two or more IC devices arranged on substrates such as silicon wafers, wherein the wafers are bonded by a direct bonding technique to form a wafer assembly, and wherein the multiple IC devices are provided with metal contact structures. A TSV (Through Semiconductor Via) is produced through the bonded wafer assembly, wherein the IC device or devices in the upper wafer or wafers have contact structures that serve as masks for the etching of the TSV opening. A conformal isolation liner is deposited in the TSV opening, and subsequently removed from the bottom and any horizontal areas in the TSV opening, while maintaining the liner on the sidewalls, followed by deposition of a TSV plug in the TSV opening. The removal of the liner is done without applying a lithography step, preferably by applying a plasma treatment in a plasma atmosphere comprising a polymer forming component and an etching component, the amounts of the components as well as other plasma parameters being tuned to remove the liner from the bottom and horizontal areas while not etching and/or protecting the sidewalls of the TSV opening.

The present disclosure is more particularly related to a method for bonding and interconnecting a first IC device arranged on a first substrate to a second IC device arranged on a second substrate, wherein each IC device comprises a dielectric bonding layer at its outer surface, and wherein each IC device further comprises one or more metal contact structures, the method comprising the consecutive steps of:

positioning the first substrate with respect to the second substrate, with the bonding layers of the first and second IC device facing each other, by aligning a first metal contact structure in the first IC device to a second metal contact structure in the second IC device, direct bonding of the substrates, thereby forming a substrate assembly, optionally thinning the first substrate, producing by a lithography step and an etching procedure, a first opening in the first substrate, until reaching the first metal contact structure, wherein the first metal contact structure partially covers a cross-section of the first opening, with the first metal contact structure acting as a mask, etching one or more second openings in the second substrate, stopping on the second metal contact structure, the first and second opening thereby forming an aggregate opening, producing an isolation layer on the sidewalls and the bottom of at least the first opening, removing the isolation layer from at least the bottom of the first opening, while essentially maintaining the isolation layer on at least the sidewalls of the first opening, without applying a lithography step, producing a metal contact plug in the aggregate opening, the metal plug interconnecting the first and second contact structures.

According to one embodiment, the isolation layer is produced on the sidewalls and the bottom of the first opening prior to the step of etching the second opening, and the second opening is etched through the isolation layer at the bottom of the first opening, stopping on the second metal contact structure.

According to another embodiment, the first and second openings and thereby the aggregate opening are produced in a single etching step, and the isolation layer is produced on the sidewalls and the bottom of the aggregate opening, and the removing step includes removing the isolation layer from the bottom of the aggregate opening and from the portion of the first metal contact structure that is covering the cross-section, while essentially maintaining the isolation layer on the sidewalls of the first and the second opening.

The method may comprise—prior to the step of producing the first opening—bonding the opposite side of the first substrate to an additional substrate or substrate assembly, so that the second substrate is bonded to a stack of substrates, each substrate of the stack comprising a further IC device comprising a metal contact structure, and wherein:

the step of producing the first opening comprises consecutive steps of etching openings through consecutive substrates of the stack, consecutively reaching a metal contact structure in the consecutive substrates, until reaching the first metal contact structure, each of the metal structures in the consecutive substrates serves as a mask for the consecutive etching steps, the isolation layer is deposited on horizontal areas of the consecutive metal contact structures serving as masks, the removing step includes removing the isolation layer from the horizontal areas.

According to an embodiment, each of the metal structures that serves as a mask is a metal contact pad provided with an opening, so that the aggregate opening is a pyramid-shaped opening with stepwise narrower portions.

According to another embodiment, the metal structures comprise metal contact strips or grids of overlapping metal contact strips.

According to an embodiment, the step of removing the isolation layer is performed by a plasma treatment comprising the steps of:

introducing the assembly in a plasma atmosphere comprising one or more polymer-forming components and one or more etching components, treating the assembly by inducing a plasma such that a protective polymer layer is formed on at least portions of the isolation layer present on the upper surface of the assembly and on at least portions of the isolation layer present on upper portions of the sidewalls of the first opening, thereby protecting the portions of the isolation layer where the protective polymer layer is being formed, from the plasma, wherein portions of the isolating layer being exposed to the plasma are etched.

The polymer-forming components may be chosen from the group consisting of $C_4F_6$, $CH_4$, $C_2H_4$ and $CH_3F$. The etching components may be chosen from the group consisting of $CF_4$, $C_4F_8$, $CHF_3$ and $SF_6$. The plasma may be induced by radio frequency power. The radio frequency power may comprise a low frequency component providing acceleration of ions in the plasma and a high frequency component sustaining the plasma and controlling a density of the plasma. The plasma atmosphere may further comprise Ar, $O_2$, $N_2$ and/or CO. The method may further comprise removing the protective polymer layer (20) after the plasma treatment. The removal of the liner may be performed using a Reactive Ion Etching (RIE) device.

According to an embodiment, at least the first opening is formed by an essentially anisotropic etching procedure for producing an opening having an essentially constant cross-section, followed by an isotropic etching procedure, configured to create or enhance one or more overhang areas in the opening.

BRIEF DESCRIPTION OF THE DRAWINGS

FIGS. 1A to 1J illustrate the steps of the method for bonding and interconnecting two semiconductor wafers according to an embodiment of the present disclosure.

DETAILED DESCRIPTION OF CERTAIN ILLUSTRATIVE EMBODIMENTS

Figure 1E:
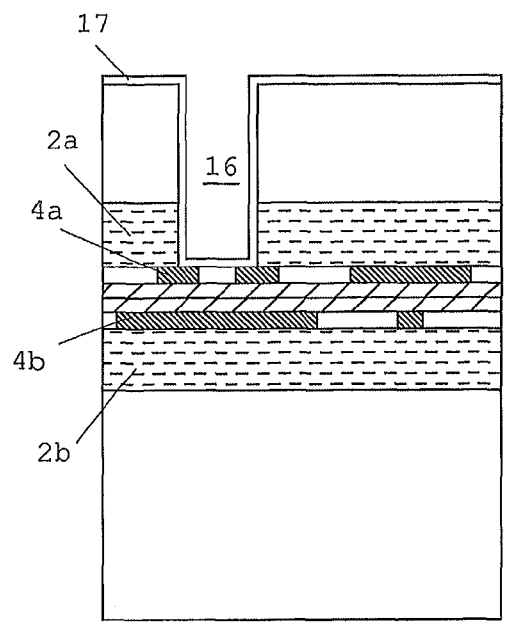

FIG. 1A shows the starting point of the method according to an embodiment for bonding and interconnecting two IC chips. Two wafers 22/21 are provided which are to be bonded in a wafer-to-wafer bonding technique. Each of the wafers comprises a semiconductor support substrate 1a/1b, e.g. a silicon substrate carrying at least one semiconductor chip 10a/10b. These chips 10a/10b are to be bonded to form a 3D integrated device stack. Each chip 10a/10b comprises a Front-End-Of-Line (FEOL) portion produced on the semiconductor substrate and a Back-End-Of-Line (BEOL) portion on the FEOL portion. The terms FEOL and BEOL are known in the art of semiconductor processing. FEOL refers to the part comprising active components such as transistors, and BEOL refers to the part comprising a metallization stack, i.e. a stack of dielectric layers with metal lines and via connections embedded therein, connecting the components of the FEOL portion to contact structures external to the chip. The FEOL and BEOL portions are schematically indicated, without a visible distinction being made between FEOL and BEOL, by reference numerals 2a/2b. The chips 10a/10b furthermore comprise passivation layers or redistribution layers 3a/3b which are further dielectric layers on top of the BEOL portion with metal contact structures embedded therein, with the latter contact structures being configured for connecting the chip to other contacts external to the chip.

The metal contact structures in the embodiment shown in FIG. 1A comprise metal contact pads 4a and 4b in the upper chip 10a and the lower chip 10b respectively, which are to be electrically connected by the method of the present disclosure. On top of the redistribution layers are dielectric bonding layers 5a/5b suitable for direct bonding. The direct bonding technique is known per se. As illustrated in FIG. 1B, the wafers are positioned by aligning the metal contact pads 4a and 4b and the bonding layers 5a/5b are brought into mutual contact. An annealing step is preferably performed in order to establish a strong bond. The dielectric material of the bonding layers may be silicon oxide or the bonding layers may comprise a stack of different materials. The bonding layers may be blanket dielectric layers or they could comprise metal areas and dielectric areas, wherein metal is bonded to metal and dielectric to dielectric. In this case the bonding technique still falls under the denomination "direct bonding," but it is also known as "hybrid bonding."

When the bond is formed, the result is an assembly of the two wafers 22/21 as shown in FIG. 1B. This assembly is then subjected to a polishing step, to remove a portion of the top wafer's semiconductor substrate 1a, typically reducing this substrate to a thickness of less than 50 micrometer. The result of this thinning step is illustrated in FIG. 1C.

In the bonded wafer assembly, the upper metal contact pad 4a is located above the lower metal contact pad 4b. Both pads may for example have a circular or polygon shaped surface. The lower contact pad 4b is a full metal pad without interruptions or openings, whereas the upper pad 4a has an opening 15, preferably in the center, for example a circular opening. The outer diameter of the lower pad 4b and the diameter of the circular opening 15 are chosen such that, taking into account the tolerance of the wafer-to-wafer alignment process, the opening 15 is located within the boundaries of the lower pad 4b.

By a lithography and anisotropic etch step (FIG. 1D), preferably a plasma etch step, a TSV opening 16 is etched through the back of the thinned upper semiconductor substrate 1a, through the FEOL/BEOL portion 2a of the upper device 10a, and stopping on the upper contact pad 4a. The TSV opening 16 is preferably a cylindrical opening with a given diameter. The litho/etch step involves producing a resist mask on the upper substrate 1a, etching the area not covered by the resist mask, followed by stripping of the resist. The TSV opening 16 is produced above the upper contact pad 4a that is provided with the opening 15. The outer diameter of the contact pad 4a and of the opening 15 in the center of the contact pad 4a are chosen with respect to the diameter of the TSV opening 16, and taking into account the tolerance on the alignment of the litho-mask for producing the TSV opening 16, so that that the cross section of the TSV opening 16 fully covers the circular opening 15 and a portion of the pad 4a itself, whilst staying within the outer boundaries of the contact pad 4a. In the ideal case shown in the figures, i.e. the case where no alignment or overlay errors are occurring, the TSV opening 16 is concentric with the circular opening 15 and with the contact pad 4a itself.

Then a conformal dielectric layer 17 is deposited on the upper surface of the thinned substrate 1a, the sidewalls of the TSV opening 16 and the bottom of the TSV opening 16, see FIG. 1E. This conformal dielectric layer 17 is also known as a liner dielectric, hereafter referred to in short as the "liner." Its function is to isolate semiconductor materials in the substrate 1a and in the FEOL/BEOL portion 2a of the upper device 10a from the metal contact plug that is to be formed in the TSV opening 16. The material and deposition technique for forming the liner is therefore also known to the skilled person. The liner may consist of or comprise $SiO_2$, SiCO, SiN, SiCN or other suitable materials, deposited for example by Atomic Layer Deposition or Chemical Vapour Deposition (CVD).

Figure 1F:
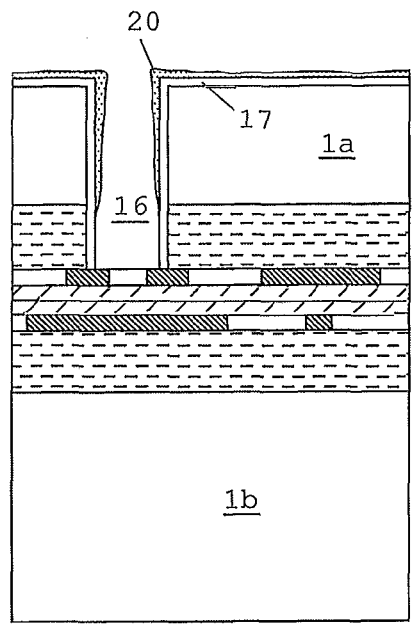

According to the present disclosure, the liner 17 is subsequently removed from the bottom of the TSV opening 16 while on the sidewalls of the TSV opening, the liner remains at a thickness sufficient to perform the isolating function (FIGS. 1F/1G). This is achieved without a lithography step, i.e. without forming a photoresist mask or a hardmask that covers the sidewalls and exposes a portion of the bottom of the TSV opening 16. This means that the overlay accuracy of such a second litho/etch step does not need to be taken into account, which allows a reduction in the outer diameter of the upper metal contact pad 4a as well as in the diameter of the TSV 16 as such, compared to the method of U.S. Publication No. 2014/0264862.

One way of removing the liner 17 from the bottom of the TSV opening 16 while essentially maintaining the liner on the sidewalls is by subjecting the conformal layer 17 in the TSV opening 16 to a plasma treatment under a gaseous atmosphere that comprises a polymer-forming component and an etching component. The polymer-forming component may be for example $CH_4$, $C_2H_4$ and/or $CH_3F$. The etching component may be $CF_4$, $C_4F_8$, $CHF_3$ and/or $SF_6$. The plasma treatment may be performed in an RIE (Reactive Ion Etching) tool as known in the art. The plasma may be induced by applying an RF electromagnetic field in the reaction chamber of the tool, with the assembly of the bonded wafers mounted in the chamber, under the gaseous atmosphere.

The inventors have found that under the correct circumstances, of which examples are given hereafter, the polymer-forming component causes the formation of a protective polymer layer 20 on top portions of the liner 17, i.e. on the upper portion of the sidewall of the TSV opening 16 and on the upper surface of the thinned substrate 1a. This is illustrated in FIG. 1F. The flux of polymer forming monomers is larger at the top of the opening compared to the bottom of the opening. As a result the thickness of the formed protective polymer layer 20 decreases as the distance from the top of the opening increases.

The etching component generates ions and other plasma constituents that travel a greater distance than the monomers originating from the polymer-forming component, when a plasma is induced. These ions and other plasma constituents reach the bottom of the TSV opening 16, so that the portion of the liner 17 present on the bottom surface of the TSV opening is etched and thereby removed, while the liner remains virtually intact on the sidewall of the TSV opening 16, because the sidewalls are essentially parallel to the trajectories of the etching constituents generated in the plasma and because the upper edge of the TSV opening is protected by the polymer layer 20. This plasma technique thus makes it possible to remove the liner from the bottom of the TSV opening whilst leaving the liner essentially intact on the sidewalls, without applying a lithography step.

In other embodiments the ratio of the polymer-forming component and the etching component in the gaseous atmosphere may be changed during the plasma treatment. It is thereby possible to increase or reduce the amount of protective polymer being formed or to increase or decrease the amount of etching of the liner during the plasma treatment. To this end, the frequency and power of the RF electromagnetic fields may also be tuned to obtain the desired etching of the liner by the plasma treatment method. By using at least two RF electromagnetic fields having different frequencies the plasma may be controlled. Advantageously, a low frequency component is used to provide acceleration of charged plasma constituents such that a directivity of the etching of the plasma treatment method may be achieved. In other words, the low frequency component of the RF electromagnetic field will drive ions present in the plasma in a given specific direction determined by the design of the plasma treatment device. It is thereby possible to achieve that ions and other plasma constituents reach the bottom of the TSV opening so that the bottom portion of the liner is etched. A high frequency component is further used to sustain and control a density of the plasma over time. This allows for tuning of the rate of protective polymer being formed as well as the etch speed of the liner.

According to embodiments of the present disclosure, the low frequency component may be any frequency component in the range of 100 kHz to 4 MHz where the suitable frequency within the range depends, for example, on the design of the plasma treatment device used. Further, the high frequency component may be any frequency component in the range of 10 MHz to 100 MHz, depending on the design of the plasma treatment device used.

The gaseous atmosphere may comprise Ar, $O_2$, $N_2$ and/or CO. By providing Ar, ignition of the plasma is achieved, while $O_2$, $N_2$ and/or CO allow for better control of the amount of protective polymer that is formed as a protective polymer layer during the plasma treatment. It is for example possible to reduce the amount of protective polymer that is formed during the plasma treatment as $O_2$, $N_2$ and CO in the treatment gas etches the protective polymer layer while being formed. Hence, the balance between formation of the protective polymer layer and the etching of the same may be controlled by controlling the amount of $O_2$, $N_2$ and CO in the plasma reactor's gaseous atmosphere. It is to be noted that $O_2$ generally will etch the protective polymer layer at a higher speed as compared to $N_2$ and CO, which may allow for further controlling the amount of the protective polymer layer being formed. The Ar, $O_2$, $N_2$ and CO gases may be used separately or in combination.

It should further be noted that a depth to a width ratio of the TSV opening 16 is preferably at least 3, which is advantageous in that a desired balance between the formation of the protective polymer layer and the etching of the liner is achieved. It may further be noted that for openings having high depth to width aspect ratios, it may be advantageous to perform the plasma treatment in cycles as described above to efficiently remove the desired portion of liner present on the bottom surface of the TSV opening.

The width of the TSV opening 16 may be between 0.1 and 20 micrometers, which is advantageous in that a desired balance between the formation of the protective polymer layer and the etching of the liner may be achieved during the plasma treatment.

A number of optimal parameter ranges are given hereafter which achieve the desired etching of the bottom portion of the liner 17, when using a RIE tool of the make Lam@ RESEARCH providing RF electromagnetic fields with the frequencies 2 MHz, 27 MHz and 60 MHz:
1) Pressure in the range of 25 to 150 mtorrs.
2) Low frequency component of 2 MHz with a power in the range of 300 W to 1500 W.
3) High frequency component of 27 MHz with a power in the range of 700 W to 2000 W.
4) Amount of Ar in the range of 200 to 2000 sccm (standard cubic centimeters per minute).
5) Amount of $O_2$ in the range of 5 to 20 sccm.
6) Amount of $CF_4$ in the range 10 to 100 sccm.
7) Amount of $C_4F_6$ in the range 20 to 50 sccm.

Figure 1G:
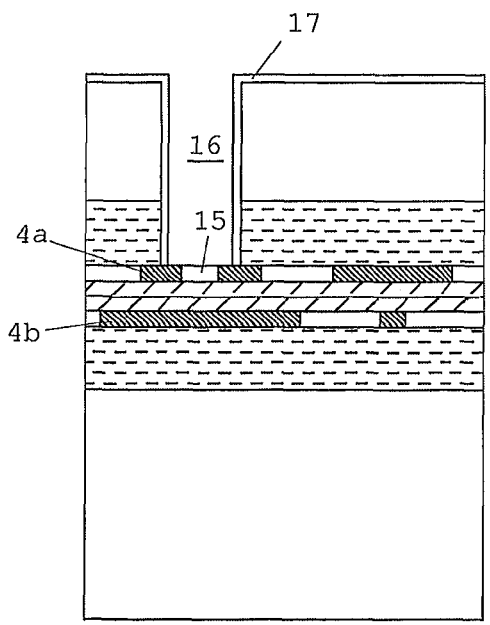

When the liner 17 has effectively been removed from the bottom of the TSV opening 16, the protective polymer layer 20 is then removed, as shown in FIG. 1G. This may be achieved by a treatment in an oxygen based plasma. Preferably the step of removing of the protective polymer layer 20 is performed subsequent to the plasma treatment for removing the liner from the bottom of the TSV opening 16. The step of removing the protective polymer layer 20 may advantageously be performed within the same plasma treatment tool where the previous plasma treatment was performed. Alternatively, the protective polymer layer may be removed using any suitable technique, such as wet etching or use of a dedicated remover.

Figure 1H:
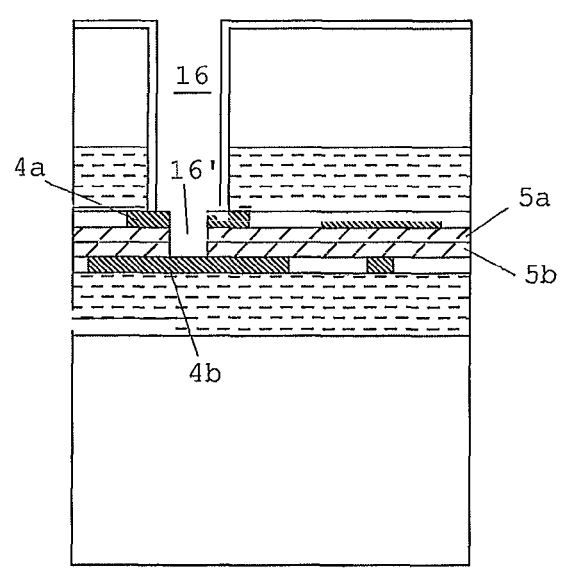

The next step (FIG. 1H) is an anisotropic etch of the dielectric material in the circular opening 15 and of the bonding dielectric 5a/5b underneath the opening, stopping on the contact pad 4b of the bottom wafer 21. In this way the TSV opening 16 is enlarged downwards by etching through the circular opening 15 of the upper contact pad 4a, i.e. using the upper contact pad 4a as a mask, until reaching the lower contact pad 4b, and thus creating an extension 16' of the TSV opening. In one embodiment, the TSV opening 16 is a "first opening," the extension 16' is a "second opening," and the combined opening formed by TSV opening 16 and its extension 16' is an "aggregate opening."

Then a seed layer and if required a barrier layer or an adhesive layer are deposited (not shown) on the interior surface of the aggregate opening 16/16', and the aggregate opening is filled with a metal, preferably by an electroplating step, preferably using copper as the deposited metal (FIG. 1I). The result is the formation of a TSV plug 18. An alternative method is electroless deposition of metal, e.g. Cu or Ni or deposition of W by Chemical Vapour Deposition. After producing the TSV in this manner, the metal in the TSV may be recessed by a chemical mechanical polishing (CMP) step (FIG. 1J).

By the above-described method, an electrical connection is established between the upper chip 10a and the lower chip 10b by a single TSV 18. The enlargement of the TSV opening 16 by further etching extension 16' downwards towards an underlying contact pad 4b does not require any litho and etch step. For this reason, the diameter of the TSV can be chosen smaller compared to existing methods, and a denser TSV pitch can be realized.

Figure 1K:
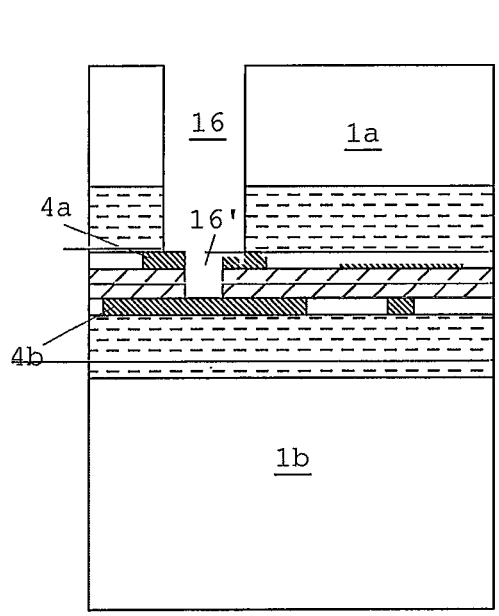
FIGS. 1K to 1N illustrate an alternative embodiment.
Figure 1L:
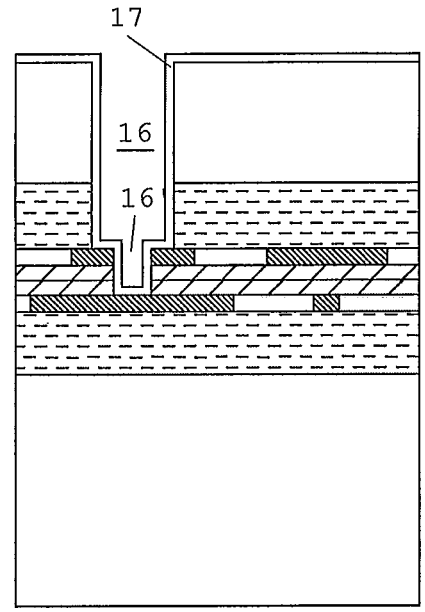
Figure 1M:
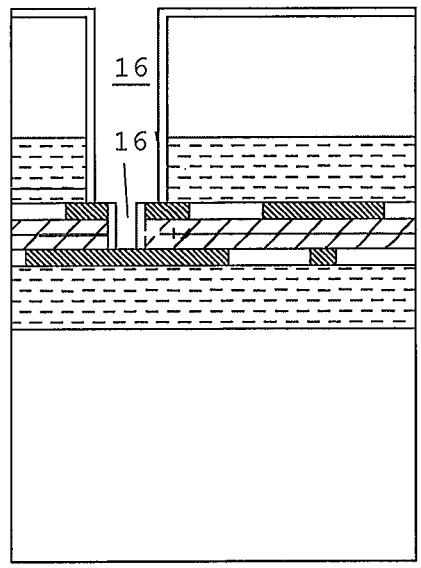
Figure 1N:
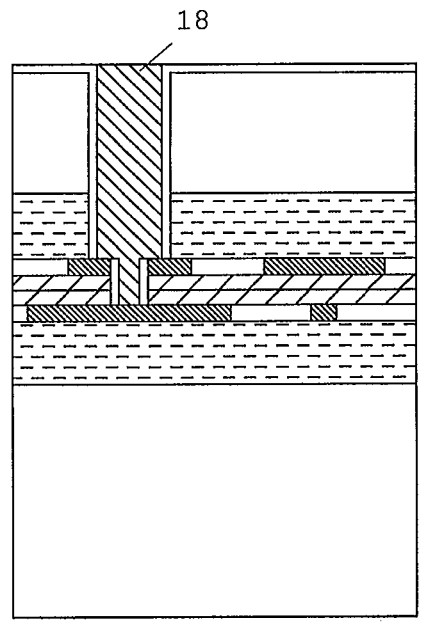

According to an alternative embodiment, the aggregate opening 16+16' is etched in a single etching step, prior to the deposition of the liner 17. This is illustrated in FIG. 1K. The liner is then deposited on the inner surface of the aggregate opening, i.e. on the sidewalls of opening 16, the upper contact pad 4a, the sidewalls of the extension opening 16' and the bottom of the extension opening 16' (FIG. 1L). By careful tuning of the liner removal process as described above, the liner is removed from the bottom of the extension opening 16' and from the surface of the upper contact pad 4a, while being maintained on the sidewalls of openings 16 and 16' (FIG. 1M). For example, more intensive polymer formation may be generated so as to produce a protective polymer layer on the liner that is present on the upper contact pad 4a, followed by a highly directive etch including components that etch the polymer, so as to remove the liner and polymer layer from the pad 4a together with the removal of the liner from the bottom of the opening 16', while the liner is maintained on the sidewalls of the opening 16 and the extension 16'. According to an embodiment, a sacrificial dielectric layer may be deposited on the upper surface of the thinned upper substrate 1a, prior to etching of the TSV opening, in order to ensure that near the upper edge of the TSV, the liner 17 is not removed from the sidewalls. As in the first embodiment, the method is then finished by deposition of the TSV plug material, and CM' to form the final TSV connection plug 18 (FIG. 1N).

Figure 2A:
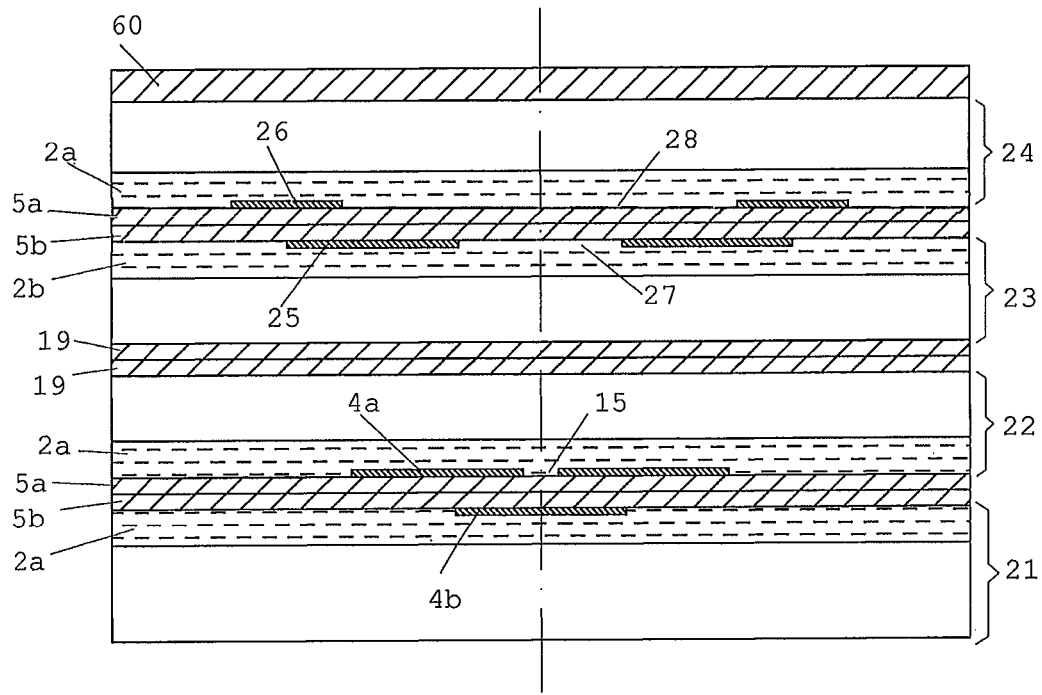
FIGS. 2A to 2F illustrate the method applied to a stack of semiconductor wafers.

The method of the present disclosure is equally applicable to a stack of more than two wafers. A first embodiment of this kind is illustrated in FIGS. 2A to 2F. FIG. 2A shows a stack of 4 wafers, assembled by the following sequence: wafers 21 and 22 are bonded by direct bonding in the above-described manner to form a first wafer assembly. Wafers 23 and 24 are equally bonded by direct bonding to form a second wafer assembly. Then the two assemblies are bonded together by direct bonding to form the stack. Wafers 22 and 23 are thereby bonded back to back (after being provided by dielectric bonding layers 19). Wafer 21 is provided with the full metal contact pad 4b as described above. Wafer 22 is provided with the contact pad 4a with the central opening 15. Wafers 23 and 24 are provided with metal contact pads 25 and 26 respectively. Contact pad 25 has a central opening 27 and contact pad 26 has a central opening 28. The openings 15, 27 and 28 are concentrically aligned, the sizes of the contact pads and openings being chosen so as to take into account the wafer-to-wafer mismatch in the bonding process of bonding wafers 21 and 22, the bonding process of wafers 23 and 24 and the bonding process of bonding the assemblies 21/22 and 23/24. All contact pads 4a/4b/25/26 and openings 15/27/28 are circular in shape (though this is not a limitation of the scope of the present disclosure; square or other polygon shapes are possible as well for example, as well as any other suitable shape). For the sake of not complicating the drawings, the metal contact pads are shown as part of the FEOL/BEOL portions 2a/2b of the various wafers, even though in reality these contacts pads will be incorporated in a passivation layer or a redistribution layer.

FIG. 2A shows the full assembly assuming zero wafer-to-wafer alignment mismatch. In reality the openings 15, 27 and 28 are not perfectly aligned, but the correct choice of the dimensions ensures that each opening falls within the outer boundaries of the contact pad directly underneath. The upper wafer 24 of the stack is provided on its backside (i.e. the upper surface of the stack), with a sacrificial dielectric layer 60, deposited on the backside of wafer 24 before or after formation of the stack. The function of the sacrificial layer will be explained further in this description. By a lithography and etch process, an opening 30a with diameter $\Phi$ is etched in the upper wafer 24 of the stack, concentrically with the opening 27 in the metal contact pad 26 of the upper wafer. The diameter $\Phi$ is chosen taking into account the overlay mismatch in the lithography step.

Figure 2B:
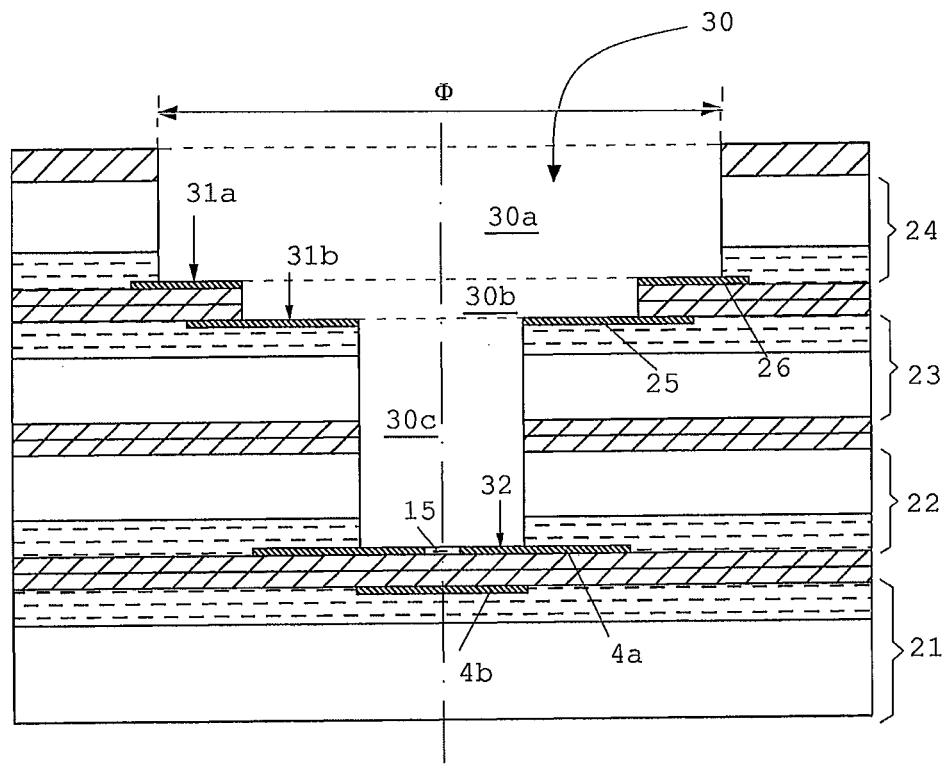

When reaching contact pad 26, etching continues using the contact pad 26 as a mask, until reaching the metal contact pad 25 of wafer 23, which in turn serves as a mask for the continued etching down to metal contact pad 4a of wafer 22. Etching is stopped when reaching the metal contact pad 4a. As shown in FIG. 2B, a first opening 30 is thereby formed, having a pyramid-shape as seen in the cross-sections shown in the drawings, and consisting of consecutively narrower sub-portions 30a, 30b and 30c, landing on horizontal areas 31a, 31b of the consecutive contact pads 26 and 25, and finally on the bottom area 32, i.e. the bottom surface of the narrowest sub-portion 30c. Etching of the opening 30 is preferably done by plasma etching, and as illustrated in the figures, this etch process is preferably an essentially anisotropic etching process. Further in this description the meaning of the term anisotropic in the context of this specification is described in more detail, as well as possible deviations from a purely anisotropic etch process.

Figure 2C:
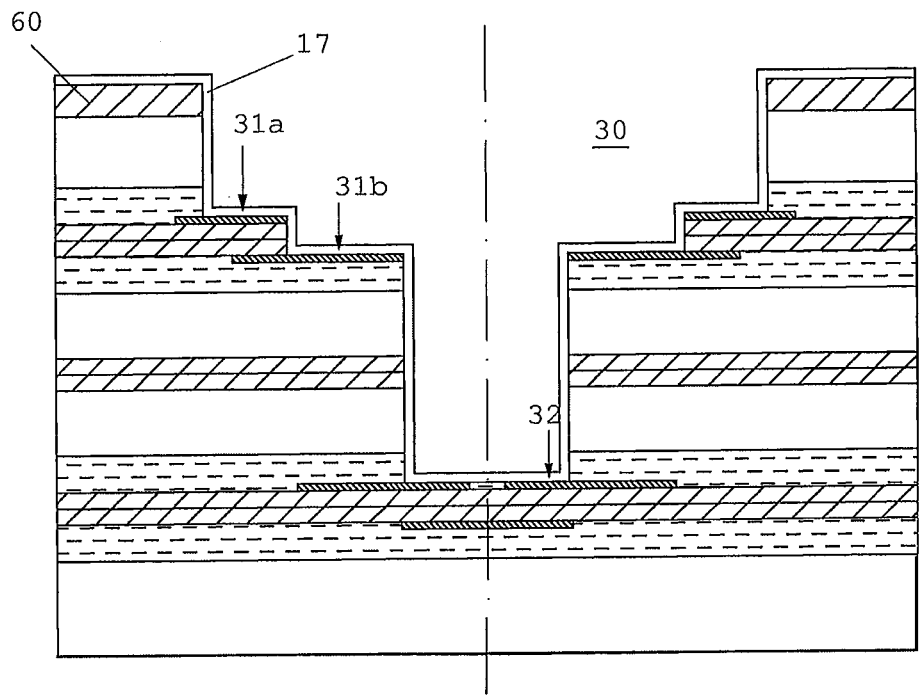
Figure 2D:
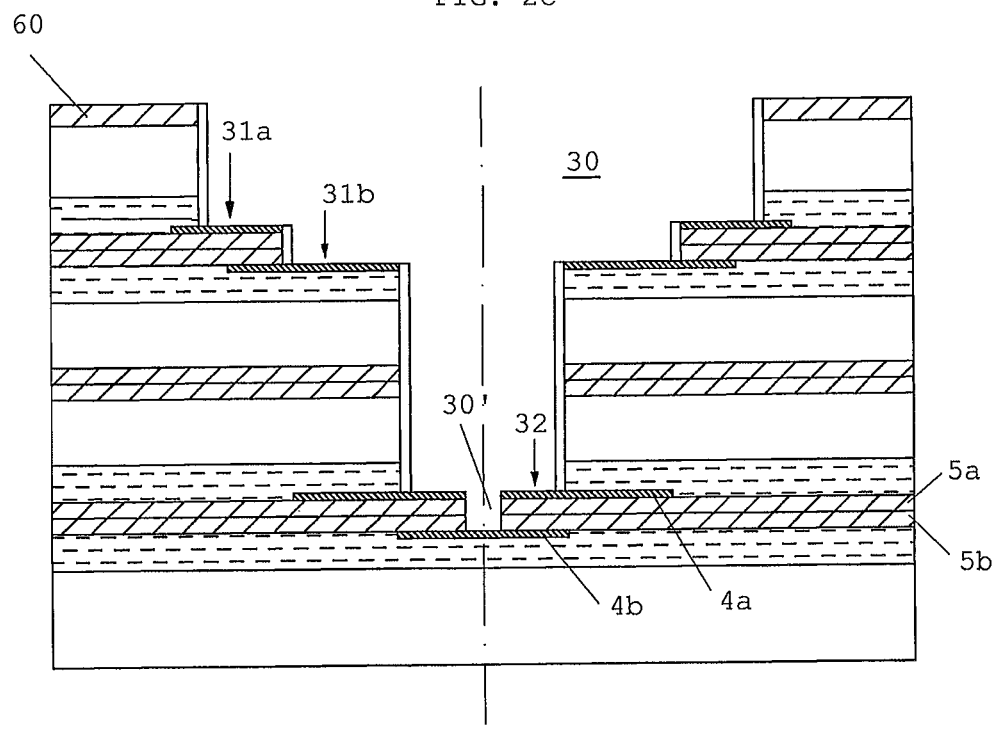
Figure 2E:
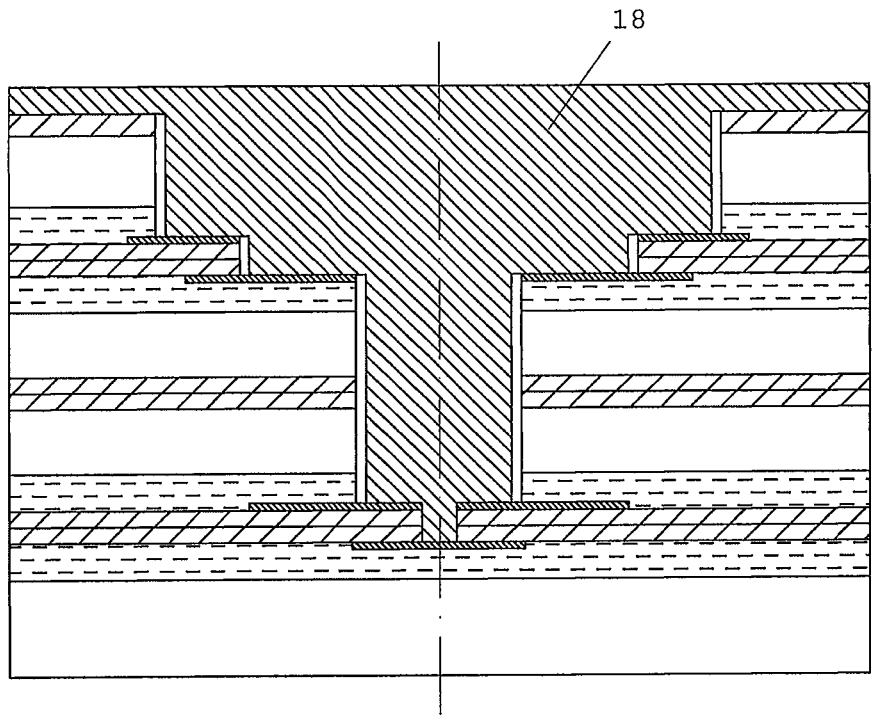
Figure 2F:
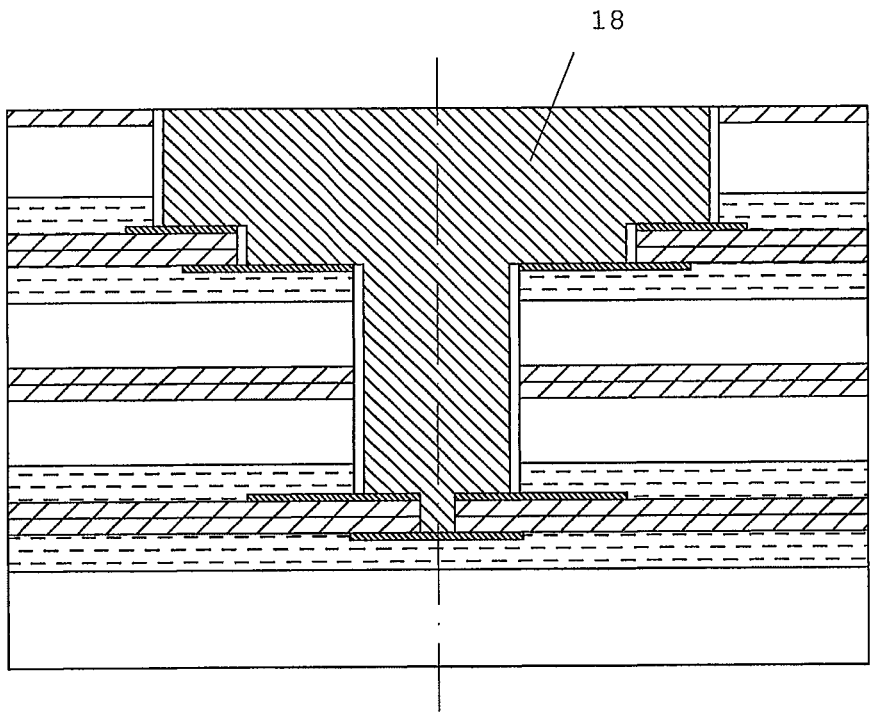

The formation of the first opening 30 is followed by the deposition of the liner 17 on the sidewalls of all the subportions of the opening 30, on top of the sacrificial layer 60, on the horizontal areas 31a/31b, and on the bottom area 32, as shown in FIG. 2C. As in the embodiment of FIG. 1, the liner is removed from the bottom area 32 and from the horizontal areas 31a/31b, without a lithography step, preferably by a plasma treatment, whereby the liner 17 is essentially maintained on the sidewalls of each sub-portion 30a/30b/30c of the first opening 30. The plasma treatment again involves the above-described use of polymer-forming and etching components. For removing the liner in a pyramid-shaped opening, the treatment is preferably performed in a plurality of stages, each defined by appropriate frequency settings to control the directivity of the etch process, and by a particular composition of the plasma atmosphere in terms of the polymer-forming component and the etching component and/or in terms of additional components which influence the polymer-formation such as $O_2$, $N_2$ and CO. For example, a first stage can be applied with a high amount of polymer-forming components relative to the amount of etching components, in order to form a protective polymer layer on all the horizontal surfaces 31a/31b/32 and the upper surface of the sacrificial layer 60. This is then followed by a highly directive plasma etch, i.e. reduction of the polymer-forming component relative to the etching component, tuning of the low frequency to enhance directivity and possibly addition of polymer-etching components such as $O_2$. The directivity of the plasma ensures that the polymer is mainly etched on the horizontal surfaces and not or very little on the sidewalls. In this way, it is possible to remove not only the polymer from the horizontal surfaces 31 but also remove the liner from these surfaces, while maintaining the liner on the sidewalls of the opening 30. The sacrificial layer 60 is needed in order to protect the upper edges of the opening 30. Without the sacrificial layer, the liner would be at risk of being removed from the upper portion of the sidewalls in the upper sub-portion 30a of the opening 30, due to the repeated and intensive etching steps required for removing the liner from all the horizontal surfaces 31a/31b/32 of the opening.

In the next step of the process (see FIG. 2D), contact pad 4a is used as a mask to form opening 30' through the dielectric bonding layers 5a/5b that bond wafers 21 and 22 together, until stopping on the full metal contact pad 4b of wafer 21. Opening 30' thus forms an extension of the pyramid shaped first opening 30. The plasma composition and etch parameters are tuned to obtain this result. For example at the end of the process, before reaching the full metal contact pad 4b, some liner material and possibly some polymer need to be left on the horizontal surfaces 31a/31b, so that these materials are removed essentially simultaneously with the last of the dielectric material in opening 30'. In one embodiment, the pyramid-shaped opening 30 is a "first opening," extension 30' of the pyramid-shaped opening is a "second opening," and the combined opening formed by openings 30 and 30' is an "aggregate opening." Then the TSV plug 18 is formed in the aggregate opening 30+30' (FIGS. 2E and 2F) by a process as described above (e.g. deposition of barrier/seed layer and Cu electroplating, followed by a CMP step), interconnecting all the contact pads 4a, 4b, 25 and 26.

Figure 3:
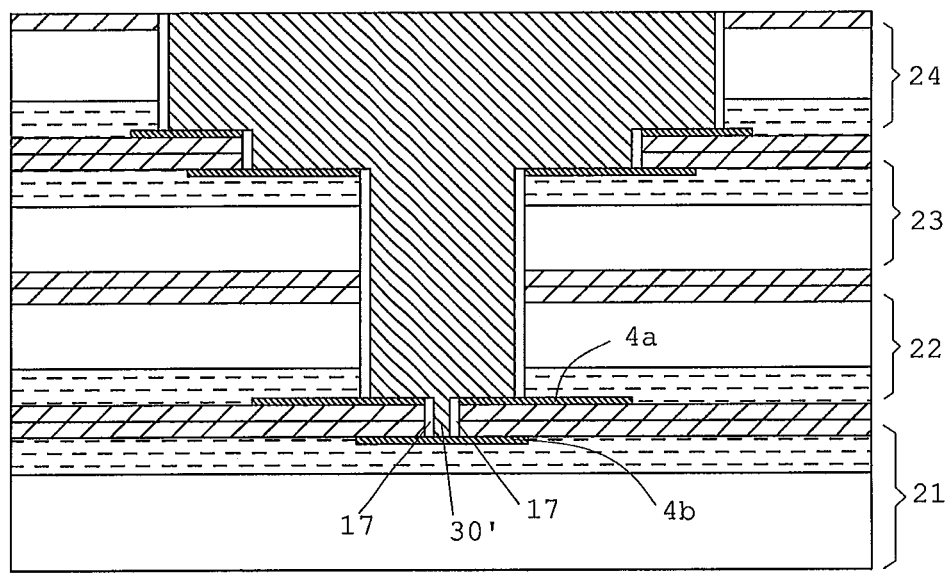
FIG. 3 illustrates an alternative to the embodiment of FIGS. 2A to 2F.

According to another embodiment illustrated in FIG. 3, etching to form the pyramid-shaped opening 30 is not stopped when reaching metal contact pad 4a, but continues until stopping on the metal contact pad 4b of wafer 21. In other words, the pyramid-shaped opening 30 and its extension 30' are etched in a single etching step. This is followed by deposition of the liner 17 on all the sidewalls and horizontal areas of the aggregate opening 30+30', also on the sidewalls and the bottom area of the extension 30'. Then follows the removal of the liner from all horizontal areas 31a/31b/32 and the bottom of extension 30', while essentially maintaining the liner on all sidewalls, and by deposition of the TSV material in the aggregate opening. The difference with the embodiment of FIG. 2 is that liner material is present on the sidewalls of the extension 30', as shown in FIG. 3.

Figure 4:
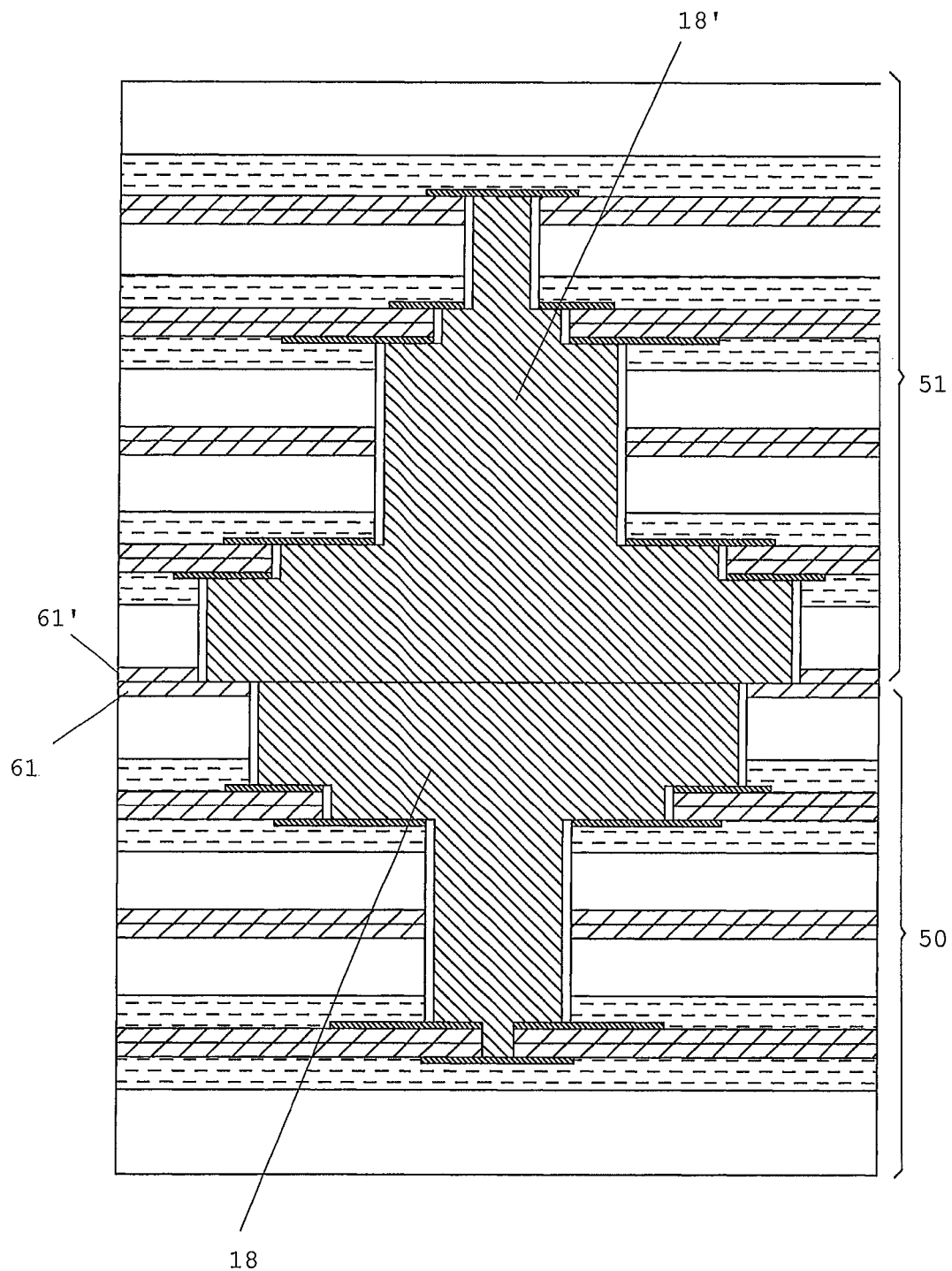
FIG. 4 illustrates the bonding of two stacks of wafers provided with interconnects produced according to the method of the present disclosure.
Figure 5A:
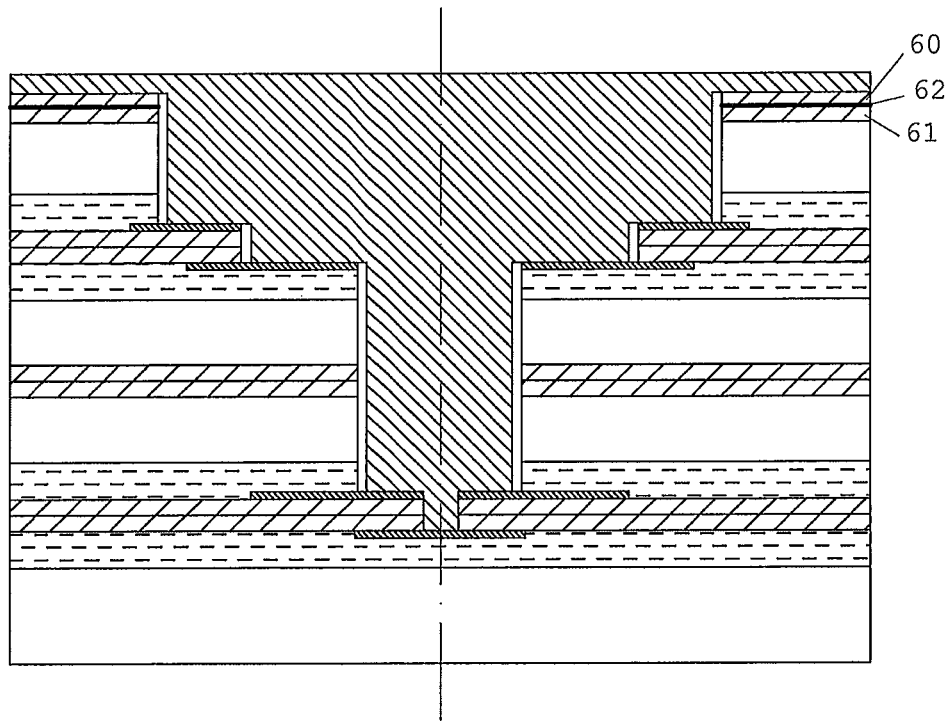
FIG. 5A to 5B illustrates an embodiment wherein a CMP stop layer is applied.
Figure 5B:
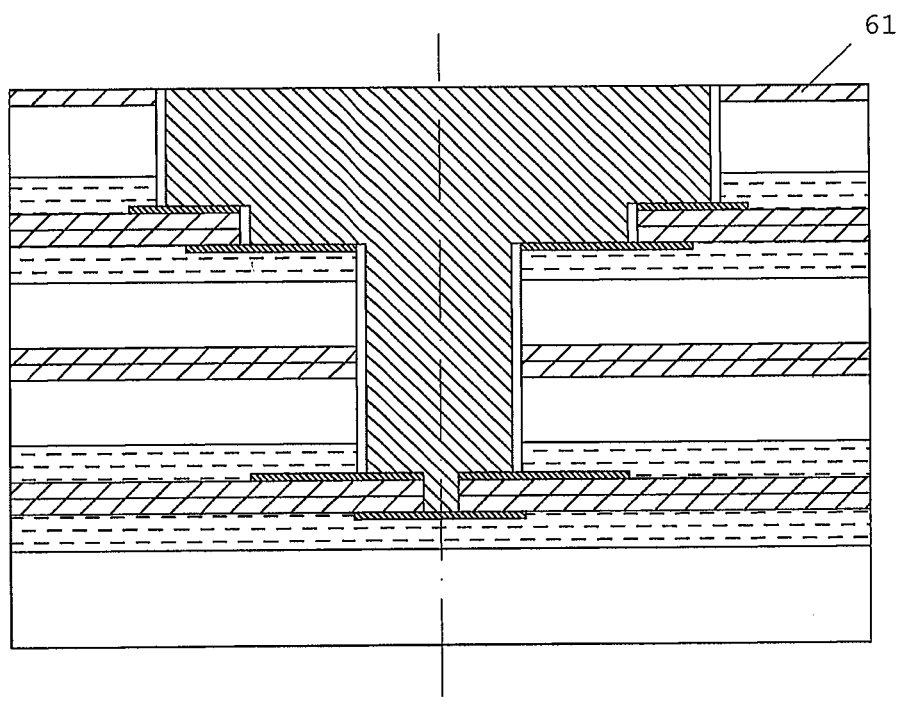

In the embodiment of FIGS. 2 and 3, the removal of the liner without using lithography, from the horizontal areas 31a/31b/32 of the pyramid-shaped opening 30 (and from the bottom of extension opening 30' in the case of FIG. 3), allows the diameter $\Phi$ of the initial opening to be chosen relatively small, so that a large number of wafers can be connected in this way. Realistically however, this number cannot be unlimited. A realistically achievable number would be 4 or 5 for example. Advantageously, it becomes possible then to combine two stacks of wafers having these pyramid-shaped TSVs, by a hybrid bonding technique, where for example a total of 9 wafers may be interconnected by combining stacks 50/51 of 4 and 5 wafers respectively, as illustrated in FIG. 4. As seen in this drawing, the stacks are provided with dielectric bonding layers 61/61', whose upper surface is in the same plane as the upper surface of the TSV plugs 18 and 18'. To achieve this, one change is made to the production process of FIGS. 2 and 3. FIGS. 5A and 5B show the last two steps of producing a stack of the same 4 wafers described with reference to FIG. 2, but with one change: It is seen that on the top surface of the stack the sacrificial layer 60 has not been deposited directly on the backside of the upper wafer 24, but that on this back side of the upper wafer 24, first a dielectric bonding layer 61 and a CMP stop layer 62 has been deposited, with the sacrificial layer 60 deposited on top of the CMP stop layer. The CMP stop layer 62 ensures that the CMP process stops before attacking the dielectric bonding layer 61. After removal of the CMP stop layer 62, the wafer stack can then be bonded to another stack of wafers by a hybrid bonding technique, as shown in FIG. 4. The use of a combination of any dielectric layer 61 (not necessarily a dielectric bonding layer but any layer that serves as a passivation layer for example), a CMP stop layer 62 and a sacrificial layer 60 can be used at any time instead of the single sacrificial layer 60 illustrated in FIG. 2.

Figure 6A:
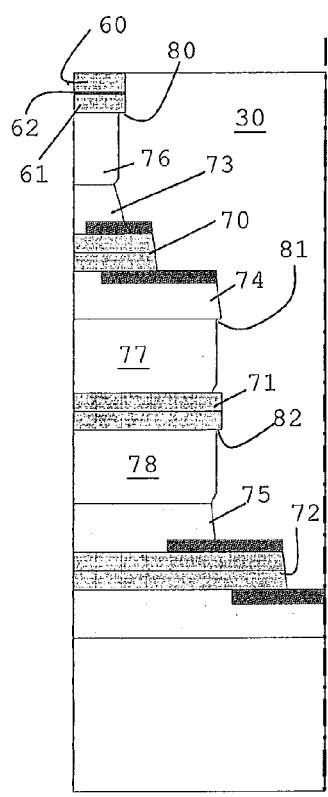
FIG. 6A to 6C illustrates a detailed profile of a plasma-etched opening as obtainable in the method according to the present disclosure for interconnecting multiple wafers in a wafer stack.

The etching process used for producing the openings 16 and 16' in the embodiments of FIGS. 1A-1J and 1K-1N, or each sub-portion 30a/30b/30c of the pyramid-shaped opening 30 (in the embodiment of FIGS. 2 and 3) is preferably a plasma etching process that is essentially anisotropic as illustrated in FIGS. 1, 2 and 3: the cross section of the openings (or sub-portions thereof) is constant, regardless of the material that is being etched. Making this process essentially anisotropic may be achieved by using a plasma atmosphere comprising a polymer-forming component and an etching component as described above in relation to the removal process of the liner. The polymer formation is used to protect layers which would otherwise be etched isotropically, such as the semiconductor material of the substrates 1a/1b. After removal of the polymer formed during plasma etching, an essentially anisotropically formed opening is the result, i.e. an opening having a constant cross section regardless of the material through which the opening is etched. Small deviations from the mathematically perfect anisotropic etch can often however not be avoided, and such small deviations are still falling under the term "anisotropic" as used within the context of the present disclosure. According to one embodiment, such small deviations from the purely anisotropic process may even be deliberately enhanced, in which case the process is better described as a mixed anisotropic/isotropic process. FIG. 6A shows a profile of the pyramid shaped opening 30 detailing small deviations from a purely anisotropic etch. This profile is characterized by a substantially anisotropic etch through the sacrificial layer 60, CMP stop layer 62 and upper bonding layer 61, and an equally substantially anisotropic etch (with small deviation in the form of a slanted sidewall) through the consecutive bonding layers 70/71/72 and FEOL/BEOL portions 73/74/75. The semiconductor substrates 76/77/78 are however etched slightly isotropically, resulting in an overhang 80/81/82 above each of the semiconductor substrates. The etch process may be performed in stages, changing the composition of the plasma and/or other etch parameters of the etch tool as a function of the material being etched.

Figure 6B:
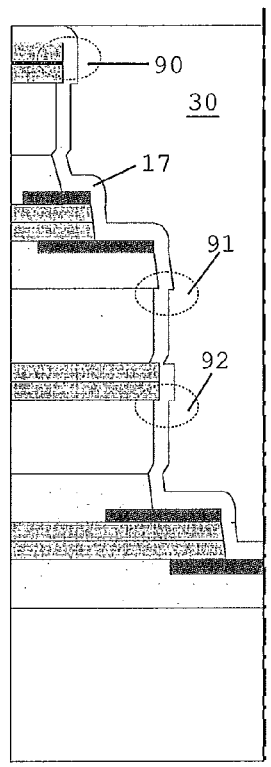
Figure 6C:
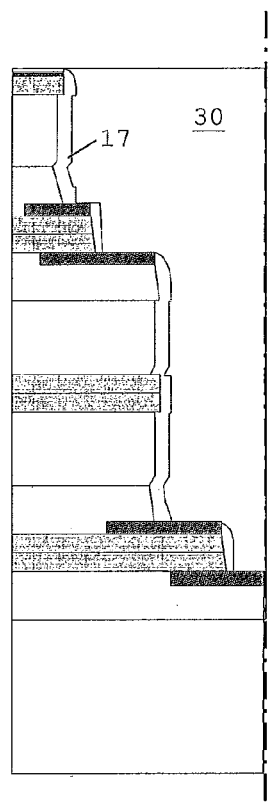

According to an embodiment, the subportions 30a/30b/30c of the complete opening 30 are first etched anisotropically, resulting in an opening wherein the semiconductor substrates 76/77/78 are protected by a polymer so that they are essentially not isotropically etched, i.e. no overhangs are formed. After stripping of the protective polymer, this is then followed by an etch step in an atmosphere without a polymer forming component, and with an etch component that has a high selectivity for the semiconductor material compared to the materials of the FEOL/BEOL portions and the bonding layers. This will cause a slight isotropic etch of the semiconductor substrates 76/77/78, resulting in the more pronounced overhangs 80/81/82 illustrated in FIG. 6A. These overhangs are beneficial in that they protect the liner 17 in areas 90/91/92 where the liner would otherwise be most in danger of becoming too thin during the liner removal process, leading to incomplete isolation of the semiconductor from the TSV plug. This is visualized in FIGS. 6B and 6C, showing the same profile after deposition of the liner 17 and the removal of the liner from the horizontal areas.

Figure 7A:
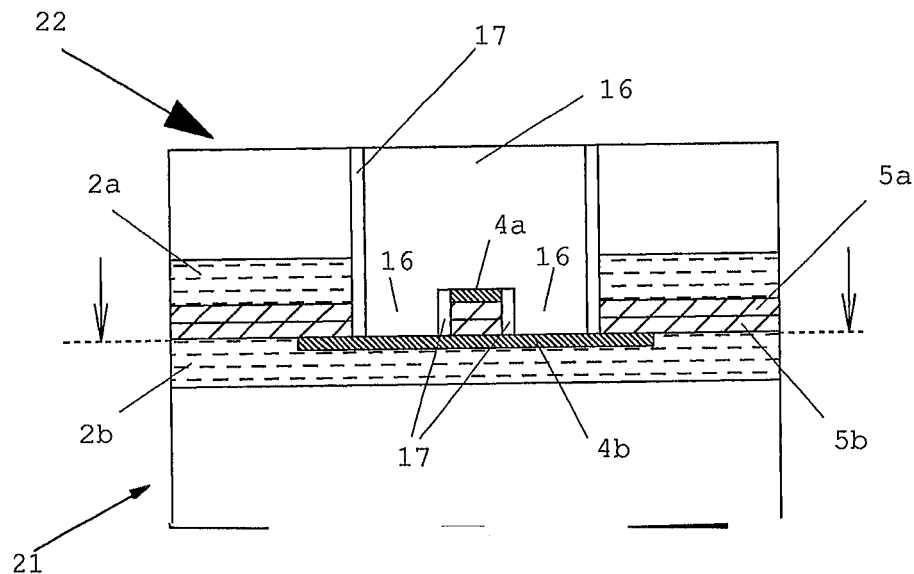
FIG. 7A to 7B illustrates an alternative pattern of metal contact structures in the method of the present disclosure.
Figure 7B:
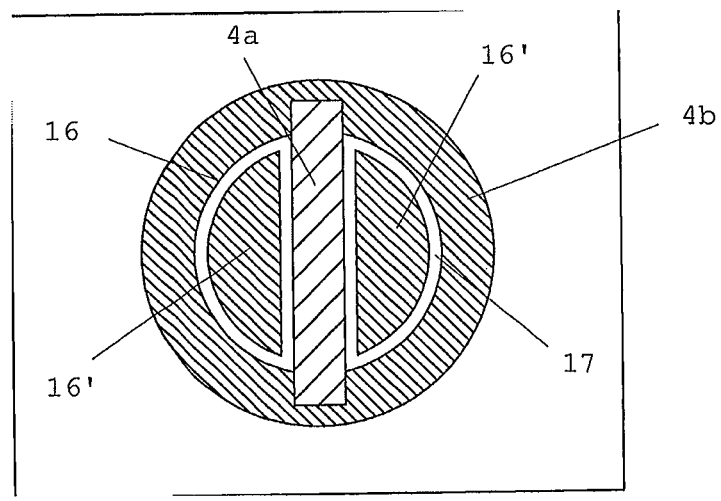

In any of the above-described embodiments, at least one metal contact pad (e.g. 4a) is used as a mask for etching through to an underlying metal contact pad (e.g. 4b), due to the fact that the above-lying contact pad only partially covers the cross section of an opening (16,30c) that is being etched down to the contact pad and beyond. A convenient mask shape is the metal pad with a central opening 15/27/28 as illustrated so far. The present disclosure is however not limited to this shape. FIGS. 7A and 7B illustrate another possible design in a bonding process of two wafers 21/22. The dielectric bonding layers 5a and 5b are indicated. In this embodiment, the metal contact pad 4a of the upper wafer 22 is a strip of metal contact material, extending transversally with respect to the full metal contact pad 4b of the lower wafer 21. The TSV opening 16 lies within the footprint of the full metal pad 4b and overlaps the strip 4a. Etching of the TSV opening takes place in a single etching step, analogous to the embodiment of FIGS. 1K-1N. The first part 16 of the aggregate TSV opening is a cylindrical part. The second part consists of two portions 16' on either side of the strip 4a. On the inner surface of this aggregate opening, the liner 17 is deposited followed by removal of the liner from the bottom of the two portions 16' and from the strip 4a, while essentially maintaining the liner on the sidewalls of the TSV opening 16+16'.

Figure 8:
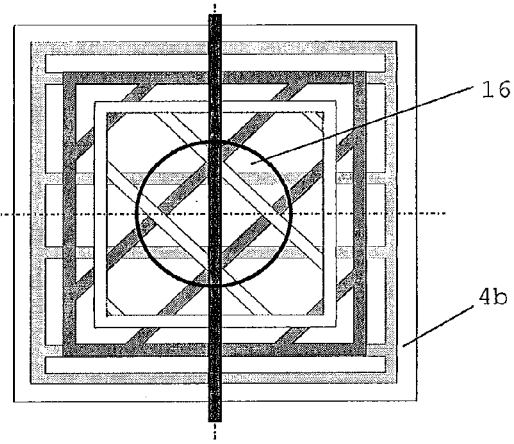
FIGS. 8 and 9A to 9D illustrate a multi-wafer embodiment wherein the various metal contact structures are formed by metal strips and grids at various levels in the wafer stack.
Figure 9A:
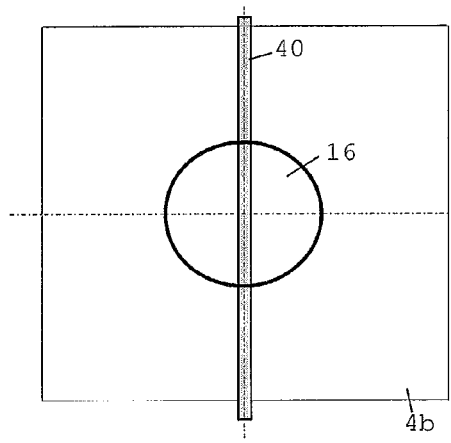
Figure 9B:
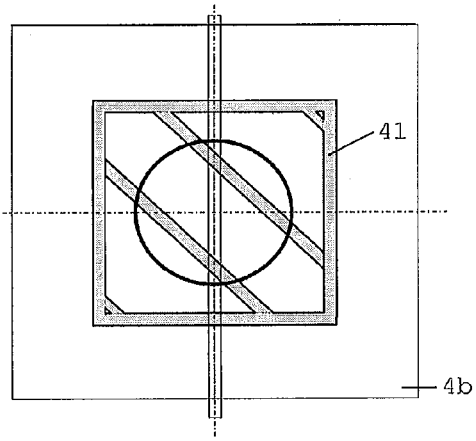
Figure 9C:
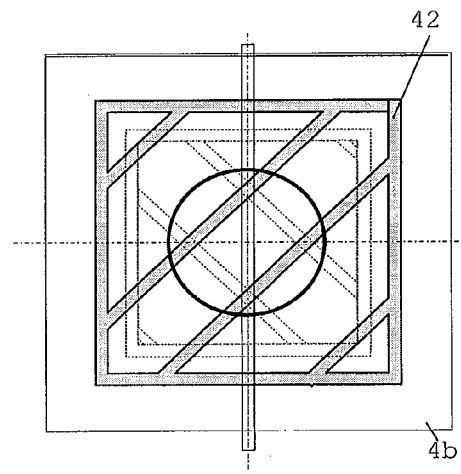
Figure 9D:
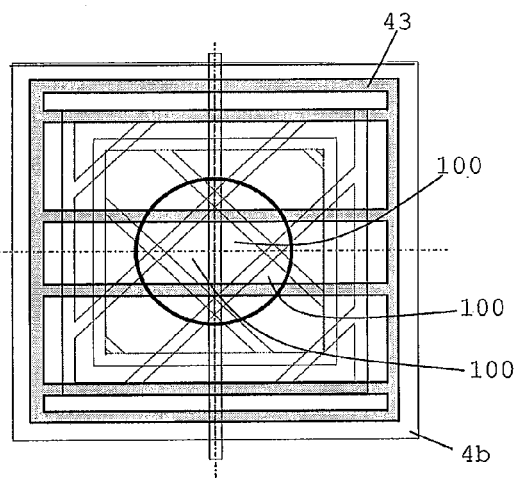

In a multi-wafer process also, the consecutive mask layers need not be concentric openings resulting in a pyramid-shaped aggregate opening. The masks may be formed by overlapping patterns of metal contact structures, allowing to form the aggregate TSV opening having a constant diameter, in a single etching step through a plurality of bonded wafers. An example of such an embodiment is shown in FIG. 8. Four consecutive patterns are shown, aligned to a full metal contact pad 4b in the bottom wafer of the stack. The TSV opening 16 has a fixed diameter. The four patterns are shown separately in FIGS. 9A to 9D. In the top wafer, the metal contact pad has the shape of a strip 40 transversal to the TSV opening 16. In the second wafer starting from the top, the metal contact pad is patterned as a grid 41 of lines at an angle of 45° to the strip 40. In the third wafer, the metal contact pad is a further grid 42 of lines at a right angle to the grid 41. In the fourth wafer, the grid 43 has lines perpendicular to the strip 40. In this way, the etching of the TSV opening is possible in a single step, reaching the full metal pad 4b in distinct areas 100. Deposition of the liner 17 takes place as described above, with the liner being deposited on all horizontal areas at the intermediate levels and at the bottom of the last level (i.e. the level of the full metal pad 4b). Removing the liner from the horizontal areas takes place again without using a lithography step, preferably using the plasma treatment described above.

Likewise, two stacks of interconnected wafers of the type shown in FIGS. 8 and 9 having constant-diameter TSVs interconnecting multiple levels could be bonded by hybrid bonding in analogy with the bonding of pyramid-shaped TSVs illustrated in FIG. 4, or stacks with pyramid-shaped TSVs could be bonded to stacks with constant diameter TSVs.

While the present disclosure has been illustrated and described in detail in the drawings and foregoing description, such illustration and description are to be considered illustrative or exemplary and not restrictive. Other variations to the disclosed embodiments can be understood and effected by those skilled in the art in practicing the claimed invention, from a study of the drawings, the disclosure and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

Unless specifically specified, the description of a layer being present, deposited or produced "on" another layer or substrate, includes the options of
said layer being present, produced or deposited directly on, i.e. in physical contact with, said other layer or substrate, and
said layer being present, produced or deposited on one or a stack of intermediate layers between said layer and said other layer or substrate.

What is claimed is:

1. A method for bonding and interconnecting a first IC device arranged on a first substrate to a second IC device arranged on a second substrate, wherein each IC device comprises a dielectric bonding layer at its outer surface, and wherein each IC device further comprises one or more metal contact structures, the method comprising the consecutive steps of:
positioning the first substrate with respect to the second substrate, with the bonding layers of the first and second IC device facing each other, by aligning a first metal contact structure in the first IC device to a second metal contact structure in the second IC device;
direct bonding of the substrates, thereby forming a substrate assembly;
optionally thinning the first substrate;
producing by a lithography step and an etching procedure, a first opening in the first substrate, until reaching the first metal contact structure, wherein the first metal contact structure partially covers a cross-section of the first opening;
with the first metal contact structure acting as a mask, etching one or more second openings in the second substrate, stopping on the second metal contact structure, the first and second opening thereby forming an aggregate opening;
producing an isolation layer on the sidewalls and the bottom of at least the first opening;
removing the isolation layer from at least the bottom of the first opening, while maintaining the isolation layer on at least the sidewalls of the first opening, without applying a lithography step; and
producing a metal contact plug in the aggregate opening, the metal plug interconnecting the first and second contact structures,
wherein prior to the step of producing the first opening, the method further comprises bonding the opposite side of the first substrate to an additional substrate or substrate assembly, so that the second substrate is bonded to a stack of substrates, each substrate of the stack comprising a further IC device comprising a metal contact structure, and wherein
the step of producing the first opening comprises consecutive steps of etching openings through consecutive substrates of the stack, consecutively reaching a metal contact structure in the consecutive substrates, until reaching the first metal contact structure,
each of the metal structures in the consecutive substrates serves as a mask for the consecutive etching steps,
the isolation layer is deposited on horizontal areas of the consecutive metal contact structures serving as masks, and
the removing step includes removing the isolation layer from the horizontal areas.

2. The method according to claim 1, wherein the isolation layer is produced on the sidewalls and the bottom of the first opening prior to the step of etching the second opening, and wherein the second opening is etched through the isolation layer at the bottom of the first opening, stopping on the second metal contact structure.

3. The method according to claim 1, wherein the first and second openings and thereby the aggregate opening are produced in a single etching step, wherein the isolation layer is produced on the sidewalls and the bottom of the aggregate opening, and wherein the removing step includes removing the isolation layer from the bottom of the aggregate opening and from the portion of the first metal contact structure that is covering the cross-section, while maintaining the isolation layer on the sidewalls of the first and the second opening.

4. The method according to claim 1, wherein each of the metal structures that serves as a mask is a metal contact pad provided with an opening, so that the aggregate opening is a pyramid-shaped opening with stepwise narrower portions.

5. The method according to claim 1, wherein the metal structures comprise metal contact strips or grids of overlapping metal contact strips.

6. The method according to claim 1, wherein the step of removing the isolation layer is performed by a plasma treatment comprising the steps of:
introducing the assembly in a plasma atmosphere comprising one or more polymer-forming components and one or more etching components,
treating the assembly by inducing a plasma such that a protective polymer layer is formed on at least portions of the isolation layer present on the upper surface of the assembly and on at least portions of the isolation layer present on upper portions of the sidewalls of the first opening, thereby protecting the portions of the isolation layer where the protective polymer layer is being formed, from the plasma, wherein portions of the isolating layer being exposed to the plasma are etched.

7. The method according to claim 6, wherein the polymer-forming components are chosen from the group consisting of C4F6, CH4, C2H4 and CH3F.

8. The method according to claim 6, wherein the etching components are chosen from the group consisting of CF4, C4F8, CHF3 and SF6.

9. The method according to claim 6, wherein the plasma is induced by radio frequency power.

10. The method according to claim 6, wherein the plasma atmosphere further comprises Ar, O2, N2 and/or CO.

11. The method according to claim 6, the method further comprising removing the protective polymer layer after the plasma treatment.

12. The method according to claim 1, wherein the removal of the isolation layer is performed using a Reactive Ion Etching (RIE) device.

13. A method for bonding and interconnecting a first IC device arranged on a first substrate to a second IC device arranged on a second substrate, wherein each IC device comprises a dielectric bonding layer at its outer surface, and wherein each IC device further comprises one or more metal contact structures, the method comprising the consecutive steps of:
  positioning the first substrate with respect to the second substrate, with the bonding layers of the first and second IC device facing each other, by aligning a first metal contact structure in the first IC device to a second metal contact structure in the second IC device;
  direct bonding of the substrates, thereby forming a substrate assembly;
  optionally thinning the first substrate;
  producing by a lithography step and an etching procedure, a first opening in the first substrate, until reaching the first metal contact structure, wherein the first metal contact structure partially covers a cross-section of the first opening;
  with the first metal contact structure acting as a mask, etching one or more second openings in the second substrate, stopping on the second metal contact structure, the first and second opening thereby forming an aggregate opening;
  producing an isolation layer on the sidewalls and the bottom of at least the first opening;
  removing the isolation layer from at least the bottom of the first opening, while maintaining the isolation layer on at least the sidewalls of the first opening, without applying a lithography step; and
  producing a metal contact plug in the aggregate opening, the metal plug interconnecting the first and second contact structures,
  wherein the step of removing the isolation layer is performed by a plasma treatment comprising the steps of
    introducing the assembly in a plasma atmosphere comprising one or more polymer-forming components and one or more etching components,
    treating the assembly by inducing a plasma such that a protective polymer layer is formed on at least portions of the isolation layer present on the upper surface of the assembly and on at least portions of the isolation layer present on upper portions of the sidewalls of the first opening, thereby protecting the portions of the isolation layer where the protective polymer layer is being formed, from the plasma, wherein portions of the isolating layer being exposed to the plasma are etched, and wherein the plasma is induced by radio frequency power, and
  wherein the radio frequency power comprises a low frequency component providing acceleration of ions in the plasma and a high frequency component sustaining the plasma and controlling a density of the plasma.

14. The method according to claim 13, wherein the polymer-forming components are chosen from the group consisting of C4F6, CH4, C2H4 and CH3F.

15. The method according to claim 13, wherein the etching components are chosen from the group consisting of CF4, C4F8, CHF3 and SF6.

16. The method according to claim 13, wherein the plasma atmosphere further comprises Ar, O2, N2 and/or CO.

17. The method according to claim 13, the method further comprising removing the protective polymer layer after the plasma treatment.

18. A method for bonding and interconnecting a first IC device arranged on a first substrate to a second IC device arranged on a second substrate, wherein each IC device comprises a dielectric bonding layer at its outer surface, and wherein each IC device further comprises one or more metal contact structures, the method comprising the consecutive steps of:
  positioning the first substrate with respect to the second substrate, with the bonding layers of the first and second IC device facing each other, by aligning a first metal contact structure in the first IC device to a second metal contact structure in the second IC device;
  direct bonding of the substrates, thereby forming a substrate assembly;
  optionally thinning the first substrate;
  producing by a lithography step and an etching procedure, a first opening in the first substrate, until reaching the first metal contact structure, wherein the first metal contact structure partially covers a cross-section of the first opening;
  with the first metal contact structure acting as a mask, etching one or more second openings in the second substrate, stopping on the second metal contact structure, the first and second opening thereby forming an aggregate opening;
  producing an isolation layer on the sidewalls and the bottom of at least the first opening;
  removing the isolation layer from at least the bottom of the first opening, while maintaining the isolation layer on at least the sidewalls of the first opening, without applying a lithography step; and
  producing a metal contact plug in the aggregate opening, the metal plug interconnecting the first and second contact structures, wherein at least the first opening is formed by an essentially anisotropic etching procedure for producing an opening having an essentially constant cross-section, followed by an isotropic etching procedure, configured to create or enhance one or more overhang areas in the opening.

* * * * *